United States Patent
Liu et al.

(10) Patent No.: US 11,948,951 B2
(45) Date of Patent: Apr. 2, 2024

(54) WIDE SPECTRUM MULTI-BAND DETECTION STRUCTURE WITH SELECTIVE ABSORPTION ENHANCEMENT AND PREPARATION METHOD THEREOF

(71) Applicant: Xi An Technological University, Xi An (CN)

(72) Inventors: Huan Liu, Xi An (CN); Weiguo Liu, Xi An (CN); Yan An, Xi An (CN); Minyu Bai, Xi An (CN); Jun Han, Xi An (CN); Zhuoman Wang, Xi An (CN); Jiaxing Hu, Xi An (CN); Changlong Cai, Xi An (CN)

(73) Assignee: Xi An Technological University, Xi An (CN)

( * ) Notice: Subject to any disclaimer, the term of this patent is extended or adjusted under 35 U.S.C. 154(b) by 405 days.

(21) Appl. No.: 17/299,315

(22) PCT Filed: Nov. 23, 2019

(86) PCT No.: PCT/CN2019/120446
§ 371 (c)(1),
(2) Date: Jun. 3, 2021

(87) PCT Pub. No.: WO2020/177401
PCT Pub. Date: Sep. 10, 2020

(65) Prior Publication Data
US 2022/0059589 A1    Feb. 24, 2022

(30) Foreign Application Priority Data
Mar. 5, 2019 (CN) .......................... 201910162591.5

(51) Int. Cl.
*H01L 27/146* (2006.01)

(52) U.S. Cl.
CPC .. *H01L 27/14621* (2013.01); *H01L 27/14601* (2013.01); *H01L 27/1461* (2013.01); *H01L 27/14629* (2013.01); *H01L 27/1463* (2013.01)

(58) Field of Classification Search
CPC .......... H01L 27/14621; H01L 27/1461; H01L 27/14629; H01L 27/14601; H01L 27/1463
See application file for complete search history.

(56) References Cited

U.S. PATENT DOCUMENTS

| | | | |
|---|---|---|---|
| 2004/0108564 A1* | 6/2004 | Mitra | H01L 27/14652 257/E27.138 |
| 2010/0108861 A1 | 5/2010 | Nedelcu et al. | |

(Continued)

FOREIGN PATENT DOCUMENTS

| | | |
|---|---|---|
| CN | 108288625 A | 7/2018 |
| CN | 109887943 A | 6/2019 |

*Primary Examiner* — Chih-Cheng Kao

(57) ABSTRACT

The invention relates to a wide spectrum multi-band detection structure with selective absorption enhancement and its preparation method. The structure comprises a plurality of sub-pixel units capable of detecting incident light in different bands. Each sub-pixel unit is composed of a square well-shaped microstructure array and a metal lower electrode (2), a photosensitive layer (3) and an upper electrode (4) on the surface thereof. The size and array spacing of square well-shaped microstructures in different sub-pixel units are determined according to the detection bands of the sub-pixel units where they are located. The upper openings of the square well-shaped microstructures are hollow to form a resonant cavity, and the adjacent square well-shaped microstructures in the same sub-pixel unit form a resonant cavity, thus solving the problem that the detector structure in the prior art cannot simultaneously realize visible light-near infrared multi-band absorption enhancement detection.

4 Claims, 2 Drawing Sheets

(56) References Cited

U.S. PATENT DOCUMENTS

2012/0273662 A1    11/2012  Caldwell et al.
2014/0049812 A1    2/2014  Palanchoke et al.
2019/0173032 A1*  6/2019  Park .................. H10K 30/10

* cited by examiner

WIDE SPECTRUM MULTI-BAND DETECTION STRUCTURE WITH SELECTIVE ABSORPTION ENHANCEMENT AND PREPARATION METHOD THEREOF

TECHNICAL FIELD

The invention belongs to the technical field of photoelectric detection, specifically relating to a wide spectrum multi-band detection structure with selective absorption enhancement and its preparation method.

BACKGROUND

The principle of photodetectors is that the conductivity of irradiated materials is changed due to radiation. Photodetectors are widely used mainly for imaging and detection, industrial automatic control and photometric measurement in visible light or near-infrared bands and for infrared thermal imaging and infrared remote sensing in infrared bands. Common ones are single-band visible light imaging or single-band infrared imaging devices, which have narrow band coverage and low integration. Their applications in wide spectrum detection are limited due to large volume, heavy weight, high power consumption and insufficient utilization of incident light waves.

The imaging device is composed of an array of pixel units. Each pixel unit is composed of a plurality of sub-pixel units. The pixel units of existing visible light detectors consist of three detection areas—red light (R), green light (G) and blue light (B), which are called red light (R), green light (G) and blue light (B) sub-pixel units respectively. The light filters above in each area filter the incident light waves and selectively transmit red light, green light and blue light respectively, which are called red light (R), green light (G) and blue light (B) filters respectively. The three filters are correspondingly arranged above the three sub-pixel units and aligned up and down. Accordingly, the array of the three filters is located right above the array of pixel units, wherein the red light filter (R) is right above the red light (R) sub-pixel unit, the green light filter (G) is right above the green light (G) sub-pixel unit and the blue light filter (B) is right above the blue sub-pixel unit. Different arrangement and combination forms of red (R), green (G) and blue (B) light sub-pixel units are designed so that the incident light waves can pass through the detection element, realizing color detection imaging in visible light bands. Such a detection element has low absorption and utilization rate of light waves.

The published patent CN106328753A proposed an enhanced infrared Si-PIN detector based on MEMS microstructure and its preparation method. The detector comprises an intrinsic silicon substrate, a MEMS microstructure layer, an enhanced infrared amorphous silicon ruthenium alloy film, a metal lower electrode, a P-type area, an annular P+-type area and an upper electrode. The MEMS microstructure layer is composed of columns or holes arranged in a square array. Different reflectivities of light waves and the position of the absorption peak can be obtained through the adjustment of structural parameters of the columns or holes of the microstructure and periodic parameters of the array, thus improving the response characteristics for the specific wavelength. In the detector structure of the invention, the photosensitive surface for infrared detection is on the bottom surface of the microstructure so that the infrared detection capability is improved and the MEMS structure in the detector structure is simply described. The patent for invention only realizes absorption enhancement of near-infrared light, but fails to realize wide spectrum detection and absorption enhancement of visible light-near infrared bands.

SUMMARY

The invention aims to provide a wide spectrum multi-band detection structure with selective absorption enhancement and its preparation method and solve the problem that the detector structure in the prior art cannot simultaneously realize visible light-near infrared multi-band absorption enhancement detection.

For the purpose above, the invention adopts the following technical solution:

A wide spectrum multi-band detection structure with selective absorption enhancement, comprising a plurality of sub-pixel units capable of detecting incident light in different bands. Each sub-pixel unit is composed of a square well-shaped microstructure array and a metal lower electrode, a photosensitive layer and an upper electrode on the surface thereof. The size and array spacing of square well-shaped microstructures in different sub-pixel units are determined according to the detection bands of the sub-pixel units where they are located. The upper openings of the square well-shaped microstructures are hollow to form a resonant cavity, and the adjacent square well-shaped microstructures in the same sub-pixel unit form a resonant cavity.

Further, the structure comprises a substrate. The upper end face of the substrate comprises a red light square well array structure, a green light square well array structure, a blue light square well array structure and a near-infrared light square well array structure. A metal lower electrode, a photosensitive layer and an upper electrode are provided successively on the structural surface of the substrate. The red light square well array structure, the green light square well array structure, the blue light square well array structure and the near-infrared light square well array structure constitute a red light sub-pixel unit, a green light sub-pixel unit, a blue light sub-pixel unit and an near-infrared light sub-pixel unit with the metal lower electrode, photosensitive layer and upper electrode on their surfaces respectively. Filters are provided respectively above the red light sub-pixel unit, the green light sub-pixel unit, the blue light sub-pixel unit and the near-infrared light sub-pixel unit.

Furthermore, the spacing between the reflecting surfaces formed by each pair of lower electrodes between the inner walls of the respective square wells of red, green, blue and near-infrared light square well array structures and the outer walls of the adjacent square wells is ¼ of the central wavelength of light wave bands detected by the R (red light), G (green light), B (blue light) and IR (near infrared light) sub-pixel units.

Furthermore, the filters arranged above the red light sub-pixel unit, the green light sub-pixel unit, the blue light sub-pixel unit and the near-infrared light sub-pixel unit can only transmit red light, green light, blue light and near-infrared light respectively.

A preparation method of a wide spectrum multi-band detection structure with selective absorption enhancement, comprising the following steps:

Determining the microstructure sizes of red light, green light, blue light and infrared light square wells respectively according to working wavebands;

Preparing red light, green light, blue light and near-infrared light square well array structures simultaneously on a substrate to form a substrate;

Electrolessly plating a conductive metal film as a metal lower electrode on the surfaces of the red, green, blue and infrared light square well array structures;

Preparing a nano photosensitive layer with wide spectral response on the surface of the metal lower electrode;

Preparing a transparent conductive nanowire grid as an upper electrode on the surface of the photosensitive layer;

Etching an upper electrode, a photosensitive layer and a metal lower electrode among the red, green, blue and near-infrared light square well array structures to form mutually isolated red, green, blue and near-infrared light sub-pixel units.

Compared with the prior art, the invention has the following beneficial effects:

Three-dimensional square well microstructures with different sizes are respectively made in the respective areas of the detector substrate according to the central wavelengths of detection bands corresponding to the red, green, blue and near-infrared light sub-pixel units. The lower electrode surfaces opposite to the inner walls of square wells in the sub-pixel units and the lower electrode surfaces opposite to the outer walls of adjacent square well structures all form resonant cavities. The lower electrode surfaces opposite to the inner wall of each square well microstructure form two pairs of reflecting surfaces. The lower electrode surface opposite to the outer wall of each square well microstructure and the lower electrode surface opposite to the outer wall of the adjacent square well microstructure can at most form four pairs of reflecting surfaces. Each pair of reflecting surfaces form a resonant cavity. The incident light waves enter the resonant cavity and are absorbed by the photosensitive layer to form photo-generated carriers. The unabsorbed light waves reach the lower electrode and are reflected by the reflecting surfaces of the resonant cavity repeatedly and pass through the photosensitive layer repeatedly until the incident light waves in the resonant cavity are almost completely absorbed, thus improving the detection efficiency and sensitivity and the utilization rate of light waves. Visible light-infrared light multi-band detection units are integrated in the same device, which can realize absorption enhancement detection of visible light and infrared light at the same time.

Wherein, 1—substrate, 2—lower electrode, 3—photosensitive layer, 4—upper electrode, 111—red light sub-pixel unit, 112—green light sub-pixel unit, 113—blue light sub-pixel unit, 114—near-infrared light sub-pixel unit, 101—red light square well, 102—green light square well, 103—blue light square well, 104—near-infrared light square well.

DETAILED DESCRIPTION

The present invention will be described in detail in conjunction with the drawings and specific embodiments.

The basic principles and ideas of the present application are as follows:

The substrate of the wide spectrum detection structure is a three-dimensional array of square well microstructures. There are resonant cavities in the square wells of the square well microstructures and between the square well microstructures. A microlens array is arranged above the sub-pixel unit composed of the square well microstructure array, the lower electrode 2, the photosensitive layer 3 and the upper electrode 4 on the surface thereof. Each microlens faces the sub-pixel unit below and converges the incident light waves which pass through the filter and enter the wide spectrum detection structure. Most of the light waves hit the resonant cavity and a few hit the non-resonant part. The incident light waves pass through the conducive upper electrode 4 which can transmit visible light and near-infrared light, then pass through the photosensitive layer 3 which is made of materials sensitive to visible light and near-infrared light, and stimulate the detection film of the photosensitive layer 3 for photoelectric conversion to generate photo-generated carriers which flow out to form photocurrent under the action of the electric field. The incident light waves then reach the lower electrode 2 made of metal. The light waves incident into the resonant cavity are reflected repeatedly in the cavity and pass through the photosensitive layer 3 repeatedly until the incident light waves in the resonant cavity are almost completely absorbed, thus improving the detection efficiency and sensitivity.

In short, the structure comprises a plurality of sub-pixel units capable of detecting incident light in different bands. Each sub-pixel unit is composed of a square well-shaped microstructure array and a metal lower electrode 2, a photosensitive layer 3 and an upper electrode 4 on the surface thereof. The size and array spacing of square well-shaped microstructures in different sub-pixel units are determined according to the detection bands of the sub-pixel units where they are located. The lower electrode 2 surfaces opposite to the inner walls of the square wells in the square well microstructures form a resonant cavity. The lower electrode 2 surfaces opposite to the outer walls of the adjacent square well microstructures in the same sub-pixel unit form a resonant cavity.

Figure 1:
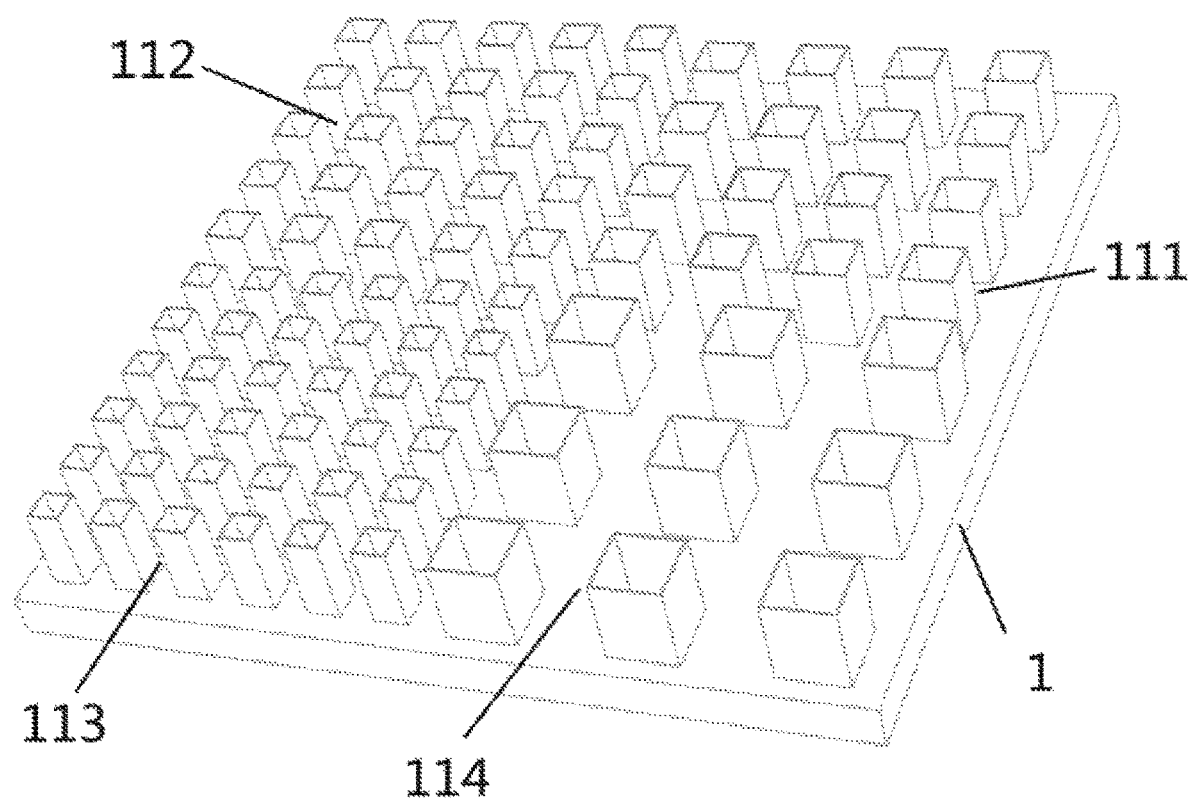
FIG. 1 is a schematic diagram of a detector structure according to an embodiment of the present invention.
Figure 2:
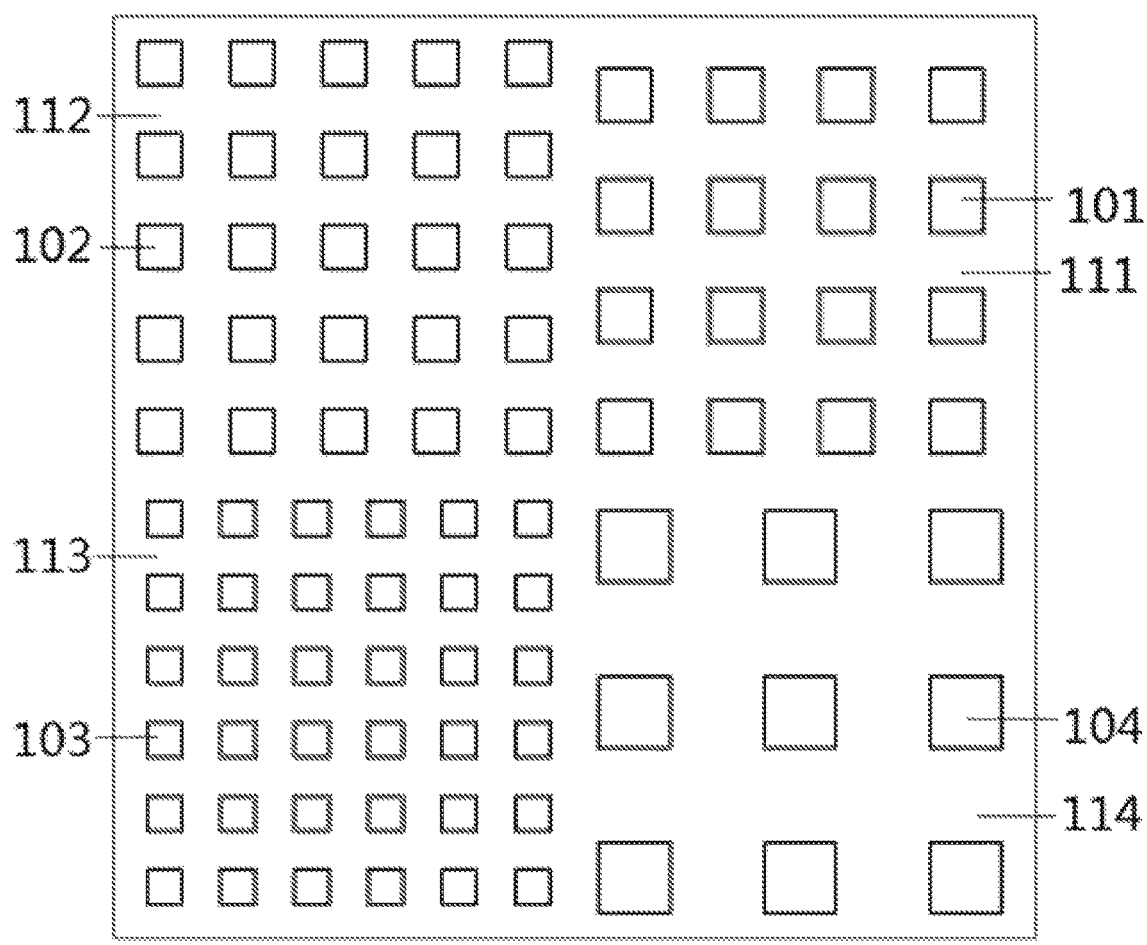
FIG. 2 is a top view of the detector structure.
Figure 3:
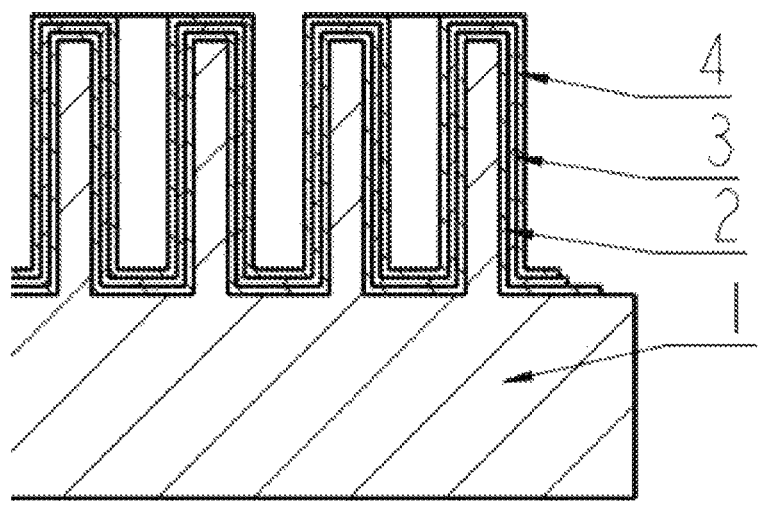
FIG. 3 is a partial sectional view of the detector structure.

A specific embodiment of the wide spectral region detection structure of the present invention is described below:

Refer to FIG. 1. It, a wide spectral region multi-band detection structure with selective absorption enhancement, comprises a substrate 1, the upper face of which comprises a red light square well array structure, a green light square well array structure, a blue light square well array structure and a near-infrared light square well array structure. A lower electrode 2, a photosensitive layer 3 and an upper electrode 4 are provided successively on the structural surface of substrate 1 layer by layer. Hence, the red light square well array structure 101, the green light square well array structure 102, the blue light square well array structure 103 and the near-infrared light square well array structure 104 constitute a red light sub-pixel unit 111, a green light sub-pixel unit 112, a blue light sub-pixel unit 113 and a near-infrared light sub-pixel unit 114 together with the lower electrode 2, photosensitive layer 3 and the upper electrode 4 on their surfaces respectively. A filter (not shown in the figure) is provided respectively above the red light sub-pixel unit 111, the green light sub-pixel unit 112, the blue light sub-pixel unit 113 and the near-infrared light sub-pixel unit 114.

It's required to design different sub-pixel units for different structural parameters of the square well array structure on substrate 1; Square well array structures with different sizes are prepared simultaneously by batch processing methods such as photolithography or plasma etching. The sizes of square well array structures are respectively related to the central wavelengths of light wavebands detected by four sub-pixel units, namely R (red light), G (green light), B (blue light) and IR (near-infrared light).

A set of specific sub-pixel unit design parameters are given below. The array structure of red light square well 101 includes several rectangular red light square wells 101 with their hollow upper ends open. The distance between the lower electrodes 2 on the surface of every two adjacent red light square wells 101 is ¼ of the central wavelength of red light. The side length of each red light square well 101 is equal to the distance between adjacent red light square wells 101. The wall thickness of red light square well 101 is 50 nm with its height of 580 nm;

The array structure of the green light square well 102 includes several rectangular green light square wells 102, the upper ends of which are hollow and open, the distance between the lower electrodes 2 on the surfaces of every two adjacent green light square wells 102 is ¼ of the central wavelength of green light, and the side length of each green light square well 102 is equal to the distance between adjacent green light square wells 102. The wall thickness of the green light square well 102 is 50 nm with its height of 580 nm;

The array structure of the blue light square well 103 includes several rectangular blue light square wells 103, the upper ends of which are hollow and open, the distance between the lower electrodes 2 on the surfaces of every two adjacent blue light square wells 103 is ¼ of the central wavelength of blue light, and the side length of each blue light square well 103 is equal to the distance between adjacent square wells. The wall thickness of the blue light square well 103 is 50 nm with its height of 580 nm;

The array structure of the near-infrared light square well 104 includes several near-infrared red light square wells 104, the upper ends of which are hollow and open, the distance between the lower electrodes 2 on the surfaces of every two adjacent near-infrared light square wells 104 is ¼ of the central wavelength of near-infrared light, and the side length of each near-infrared light square well 104 is equal to the distance between adjacent square wells. The wall thickness of the near-infrared light square well 104 is 50 nm with its height of 580 nm;

The lower electrode 2, a metal thin film, is prepared on the upper surface of substrate 1 by chemical plating or chemical vapor deposition. The metal thin film has a smooth surface with high reflectivity and can conduct electricity. Metals include gold, silver, copper, aluminum, etc. The lower electrodes 2 are prepared in the range of pixel array, and finally, the lower electrodes 2 of adjacent sub-pixel units should be insulated. After the preparation of the lower electrode 2, for each sub-pixel unit, the distance between the two opposite surfaces of the inner wall lower electrode 2 of the square well is ¼ of the central wavelength of the corresponding sub-pixel unit, and the two opposite surfaces of the inner wall lower electrode 2 of the square well form an optical resonant cavity. The distance between the opposite surfaces of the outer wall lower electrodes 2 of two adjacent square wells is ¼ of the central wavelength of the waveband detected by the corresponding sub-pixel unit. One square well can form four resonant cavities with four adjacent square wells at most.

The photosensitive layer 3, a nanoscale thin film, is prepared on the pixel array by chemical vapor deposition. It is made of materials sensitive to visible light and near-infrared light.

The upper electrode 4 is of conductive and transparent materials from visible light to near-infrared light. It comprises grids formed by one-dimensional conductive nanowire materials in various forms covering the pixel array, and finally insulating the upper electrodes 4 of adjacent sub-pixel units; The one-dimensional conductive nanowire grid is in the shape created by the random arrangement of one-dimensional conductive nanowires. Its mesh can transmit visible light and near-infrared light. One-dimensional conductive nanowires can conduct electricity; One-dimensional conductive nanowires can be carbon nanotubes, silver nanowires or gold nanowires.

Above each sub-pixel unit in the detector, there is a corresponding filter that can transmit the light waveband detected by the sub-pixel unit. The filter above each sub-pixel unit transmits light waves in the detection frequency band of this region and filters out light waves in other frequency bands to avoid interference.

The detection mechanism of the detection structure in this embodiment is as follows: When light waves enter the wide spectral region detection structure, the red filter above the red sub-pixel unit 111 only transmits red light, the green filter above the green sub-pixel unit 112 only transmits green light, the blue filter above the blue sub-pixel unit 113 only transmits blue light, and the near-infrared light filter above the near-infrared sub-pixel unit 114 only transmits near-infrared light because the filters above each sub-pixel unit can only transmit light waves in the detection band of the sub-pixel; When a light wave reaches the upper electrode 4, it penetrates the upper electrode 4 and then reaches the photosensitive layer 3, which absorbs a part of the light wave for photoelectric conversion. The light wave transmitted through the photosensitive layer 3 reaches the lower electrode 2, which reflects the light wave by its smooth surface, and reaches the photosensitive layer 3 again for photoelectric conversion. The unabsorbed light wave passes through the photosensitive layer 3 and the upper electrode 4, and then goes to the upper electrode 4 opposite the resonant cavity for photoelectric conversion again. For an incident light wave, this reflection and photoelectric conversion will occur repeatedly until the light wave is almost completely absorbed.

A specific embodiment of the preparation method of the selective absorption enhanced wide spectral region multi-band detection structure of the present invention is described below:

Step 1, respectively design square well microstructure sizes of red light, green light, blue light and infrared light according to different working wavebands;

They are:

The working wavelength of the red sub-pixel unit includes but is not limited to a certain waveband of 620-780 nm. The central wavelength of red light is considered as 700 nm. The distance between the lower electrodes of every two adjacent red light square well microstructures is designed to be ¼ of the central wavelength of red light, and the side length of each red light square well microstructure is equal to the distance between adjacent red light square well microstructures. The wall thickness of red light square well microstructures is 50 nm with its height of 580 nm;

The working wavelength of the green sub-pixel unit includes but is not limited to a certain waveband of 490-580 nm. The central wavelength of green light is considered as 546 nm. The distance between the lower electrodes of every two adjacent green light square well microstructures is designed to be ¼ of the central wavelength of green light. The side length of each green light square well microstructure is equal to the distance between adjacent green light square well microstructures. The wall thickness of the green light square well microstructures is 50 nm and the height is 580 nm.

The working wavelength of the blue light sub-pixel unit includes but is not limited to a certain waveband of 400-460 nm. The central wavelength of blue light is taken as 435 nm. The distance between the lower electrodes of every two adjacent blue light square well microstructures is designed to be ¼ of the central wavelength of blue light. The side length of each blue light square well microstructure is equal to the distance between adjacent square well microstructures. The wall thickness of the square well microstructures is 50 nm with its height of 580 nm;

The working wavelength of the infrared sub-pixel unit includes but is not limited to a certain waveband of 780-2200 nm. The central wavelength of infrared light is taken as 1550 nm. The distance between the lower electrodes of every two adjacent infrared light square well microstructures is designed to be ¼ of the selected infrared wavelength. The side length of each infrared light square well microstructure is equal to the distance between adjacent square well microstructures. The wall thickness of the square well microstructures is 50 nm with its height of 580 nm.

Step 2, prepare square well array structures of red light, green light, blue light and infrared light on substrates to form substrates;

Specifically, it includes:

201. Pretreatment of substrates:

Grind, polish and clean the silicon chips in strict accordance with the optical element cold working process and semiconductor cleaning specifications. Immerse double-sided polished intrinsic monocrystalline silicon chips with a thickness of 100 μm in a solution of $H_2SO_4:H_2O_2=3:1$, boil them at 800° C. for 10 min to remove various particles and organic pollutants on the surface of the silicon chip, and rinse them with deionized water for 5 minutes. Immerse the silicon chip in $HF:H_2O=1:10$ solution, put it there at room temperature for 15 min, remove metal pollution and oxide on the surface of the silicon chip, and rinse it with deionized water for 5 min. Immerse the silicon chip in the mixed solution of $HCl:H_2O_2:H_2O=1:1:6$, put it there at 75° C. for 10 min, remove the metal ion pollution on the surface of the silicon chip, and rinse it with deionized water for 5 min. Dry the silicon chip with nitrogen, and then put it on a hot plate to remove the moisture on the surface of the silicon chip.

202. Preparation of metal aluminum masking layer for deep silicon etching:

The AZ5214E photoresist and KW-4A desktop spin coater are adopted. Drop three to four drops of photoresist at the center of the silicon chip, and operate the machine to uniformly apply the photoresist on the silicon chip with the low rotating speed of 500/15 (rpm/s) and high of 4500/50 (rpm/s). Adopt MIRAKTMT The molyne heating plate for pre-drying at 100° C. for 60 s. Place the chip in the SUSSMA6 double-sided exposure lithography machine to expose the photoresist. Perform reverse drying for the exposed photoresist, so that the photoresist in the exposure area is under crosslinking reaction and is insoluble in the developing solution. Remove the mask plate of the silicon chip after reverse baking under the lithography machine, and carry out a flood exposure of 11 s to make the photoresist in the unexposed area undergo photosensitive reaction, ensuring that it can be dissolved in the developing solution. The silicon chip is developed with KMPPD238-II developer. Put the developed silicon chip on a hot plate at 120° C., bake it for 20 minutes, and take it out and let it cool down naturally. Form the aluminum film by the JPG560BV magnetron sputtering coater: Select the aluminum target with a diameter of 10 mm, the thickness of 1 mm and purity of 99.999%, and 99.99% chlorine gas as the working gas, and the vacuum pressure of $5.0\times10^{-3}$ Pa. Place the silicon chip with mask photoresist on the substrate holder, and close the vacuum chamber door. While vacuum the vacuum chamber with the mechanical vacuum pump and diffusion pump, preheat the mass flowmeter for 10 min, and vacuum the pipeline in the gas path. When the vacuum degree reaches $10^{-3}$ Pa, set up the background pressure of the vacuum chamber to $5.0\times10^{-3}$ Pa. Select chlorine gas as the working gas of the cleaning source, and set up the flow rate at 10 sccm and the cleaning time of 3 min. Then, conduct pre-sputtering treatment. Only charge chlorine gas with the flow rate of about 45 sccm, the power of 1 kw, and a sputtering time of 1 min. Introduce chlorine gas to make vacuum chamber pressure in working state. Turn on the power supply, and when the glow is stable, deposit an aluminum film on the surface of the silicon chip. After deposition for 20 minutes, turn off chlorine gas, wait for the vacuum chamber to cool to room temperature, then open the vacuum chamber, take out the plated sample, immerse it in acetone solution, and pattern the metal by the stripping process to obtain the metal aluminum masking layer.

203. Substrate etching by low-temperature reactive ions:

Conduct silicon deep etching process with the ICP180 etching machine produced by Oxford Instruments: put the silicon chip with an aluminum masking layer on the substrate holder with the substrate temperature at −110° C. When the reaction chamber pressure reaches 12 mTorr, the ICP power 500 W, and the oxygen flow rate 5 sccm, start the silicon deep etching, and stop the etching when the square well microstructure of 580 nm design height is etched. Finally, remove the photoresist with acetone, and the aluminum masking layer with phosphoric acid.

204. Substrate insulating layer creation by thermal oxidation:

Create a lithographic mask by the thermal oxidation of a silicon dioxide layer: The silicon chip reacts with oxidants such as oxygen or wat vapor at high temperature to generate $SiO_2$ with a thickness of 50-500 nm; $SiO_2$ plays a masking role in this process. The masking effect of the thin films is related to the thickness and diffusion coefficient of impurities.

Step 3, prepare a copper film as a low electrode on the surface of the square well array structure of red light, green light, blue light and infrared light;

Details are as follows:

Plate copper on the surface of the square well array structure at room temperature with the aqueous solution of copper sulfate (concentration 2%) as the plating solution, the plating time of 1 min, and the thickness of the plated copper film of 50-100 nm, which cause the gap distance between the outer surfaces of the inner wall lower electrodes of adjacent red light square wells in the red sub-pixel unit to be 175 nm, the gap distance between the outer surfaces of the inner wall lower electrodes of the adjacent green light square wells in the green sub-pixel unit to be 136 nm; the gap distance between the outer surfaces of the inner wall lower electrodes of the adjacent blue light square wells in the blue sub-pixel unit to be 109 nm, and the gap distance between the outer surfaces of the inner wall metal lower electrodes of the adjacent near-infrared light square wells in the near-infrared sub-pixel unit to be 387 nm.

Step 4, prepare graphene as a photosensitive layer on the surface of the metal lower electrode;

Details are as follows:

Place the square well microstructure array substrate on the quartz plate, put the quartz plate in the center of the temperature zone at the quartz tube of the vacuum tube furnace, connect and fix the flanges at both ends of the quartz tube, and vacuum the tube with the vacuum pump. When the vacuum degree of the system drops below 10 Pa, charge methane and hydrogen at the flow rate ratio of 40 sccm:40 sccm for a period of time to mix the two gases. After the pressure is stable, turn off the methane gas and turn on the switch of the tube furnace to start the stage temperature rising period. When the temperature rising reaches the heat preservation stage, anneal the copper, which is beneficial to the growth of graphene in the growth stage. Charge methane gas at the growth stage. Turn off the methane gas after the growth. Let it cool to room temperature, which is the cooling stage. Turn off hydrogen and vacuum pump and take out the square well microstructure array substrate.

Step 5, prepare a carbon nanotube grid as an upper electrode on the surface of the photosensitive layer;

Details are as follows:

Uniformly mix carbon nanotubes and ethanol by ultrasonic to form a suspension, and immerse the square well microstructure array substrate made in Step 4 into the suspension with the square well microstructure upward, wherein the immersion depth is such that all the square well microstructure sinks into the solution to form a carbon nanotube grid as an upper electrode after the ethanol is volatilized.

Step 6, deposit a zinc sulfide passivation layer and pattern it, and etch the upper electrode, the photosensitive layer and the metal lower electrode between the red, green, blue and near-infrared light square well array structures, so that the upper electrode, the photosensitive layer and the metal lower electrode stacks on the surfaces of adjacent square well array structures are insulated to form red, green, blue and near-infrared sub-pixel units with mutually isolated surface stacks.

Details are as follows:

Prepare a zinc sulfide passivation layer with a thickness of 50 nm by chemical vapor deposition. Etch the passivation layer into a square pattern array by photolithography and etching. Take the passivation layer as the masking layer, pattern the upper electrode, the sensitive layer and the metal lower electrode to form isolated red, green, blue and near-infrared light sub-pixel units.

After the above steps are done. A wide spectral region detection structure of visible light to near-infrared band with enhanced selective absorption is prepared.

Although the square well microstructure size and the array period size on the detector substrate are different, they can be simultaneously prepared on the same substrate with the same process and the same working procedure, consequently forming three-dimensional square well microstructure arrays with different sizes in sub-pixel units. The manufacturing process is featured by fewer steps and good process compatibility.

The above specific examples are applied to illustrate the invention, which only helps to understand the invention with no limitation. The technical personnel engaged in the technical field of the invention can further make more simple deductions, modifications or substitutions based on the idea of the invention.

The invention claimed is:

1. A wide spectral region multi-band detection structure with selective absorption enhancement is featured by comprising a plurality of sub-pixel units capable of detecting incident light in different bands, each sub-pixel unit is composed of a square well-shaped microstructure array and a metal lower electrode (2), a photosensitive layer (3), and an upper electrode (4) on the surface thereof, the size and array spacing of square well-shaped microstructures in different sub-pixel units are determined according to the detection bands of the sub-pixel units where they are located, the upper openings of the square well-shaped microstructures are hollow to form a resonant cavity, and the adjacent square well-shaped microstructures in the same sub-pixel unit form a resonant cavity;

further featured by comprising a substrate (1), which contains an array of red light square wells (101), green light square wells (102), blue light square wells (103) and near-infrared light square wells (104) on the upper-end face of the substrate, and contains the metal lower electrode (2), the photosensitive layer (3) and the upper electrode (4) on the structural surface of the substrate, the array structures of the red light square wells (101), the green light square wells (102), the blue light square wells (103) and the near-infrared light square wells (104) constitute a red light sub-pixel unit (111), a green light sub-pixel unit (112), a blue light sub-pixel unit (113) and a near-infrared light sub-pixel unit (114) together with the metal lower electrode (2), photosensitive layer (3) and the upper electrode (4) on their surfaces respectively, a filter is provided respectively above the red light sub-pixel unit (111), green light sub-pixel unit (112), blue light sub-pixel unit (113) and near-infrared light sub-pixel unit (114).

2. According to claim 1, the wide spectral region multi-band detection structure with selective absorption enhancement is further featured by that the spacing between reflecting surfaces formed by each pair of lower electrodes between the inner walls of the respective square wells of array structures of the red light square wells (101), the green light square wells (102), the blue light square wells (103) and the near-infrared light square wells (104) and the outer walls of the adjacent square wells is ¼ of the central wavelength of light wave band detected by R (red light), G (green light), B (blue light) and IR (near-infrared light) sub-pixel units.

3. According to the description in claim 1, the wide spectral region multi-band detection structure with selective absorption enhancement is featured by that the filters arranged above the red light sub-pixel unit (111), the green light sub-pixel unit (112), the blue light sub-pixel unit (113) and the near-infrared light sub-pixel unit (114) can only transmit red light, green light, blue light and near-infrared light respectively.

4. A method for preparing a wide spectral region multi-band detection structure with selective absorption enhancement, the detection structure comprising a plurality of sub-pixel units capable of detecting incident light in different bands, each sub-pixel unit is composed of a square well-shaped microstructure array and a metal lower electrode (2), a photosensitive layer (3), and an upper electrode (4) on the surface thereof, the size and array spacing of square well-shaped microstructures in different sub-pixel units are determined according to the detection bands of the sub-pixel units where they are located, the upper openings of the square well-shaped microstructures are hollow to form a resonant cavity, and the adjacent square well-shaped microstructures in the same sub-pixel unit form a resonant cavity, and the method is featured by comprising the following steps:

determining the microstructure sizes of red light, green light, blue light and infrared light square wells respectively according to working wavebands;

preparing red light, green light, blue light and near-infrared light square well array structures simultaneously on a substrate to form a substrate;

electrolessly plating a conductive metal film as a metal lower electrode on the surfaces of the red, green, blue and infrared light square well array structures;

preparing a nano photosensitive layer with wide spectral response on the surface of the metal lower electrode;

preparing a transparent conductive nanowire grid as an upper electrode on the surface of the photosensitive layer;

etching an upper electrode, a photosensitive layer and a metal lower electrode among the red, green, blue and near-infrared light square well array structures to form mutually isolated red, green, blue and near-infrared light sub-pixel units.

\* \* \* \* \*